(12) United States Patent
Aizawa et al.

(10) Patent No.: US 10,928,798 B2
(45) Date of Patent: Feb. 23, 2021

(54) SUBSTRATE PROCESSING APPARATUS

(71) Applicant: KOKUSAI ELECTRIC CORPORATION, Tokyo (JP)

(72) Inventors: Satoshi Aizawa, Toyama (JP); Hiroto Iwaki, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 40 days.

(21) Appl. No.: 16/141,410

(22) Filed: Sep. 25, 2018

(65) Prior Publication Data
US 2019/0094833 A1 Mar. 28, 2019

(30) Foreign Application Priority Data

Sep. 26, 2017 (JP) .............................. JP2017-184691
Aug. 27, 2018 (JP) .............................. JP2018-158159

(51) Int. Cl.
*G05B 19/18* (2006.01)
*H01L 21/677* (2006.01)
(Continued)

(52) U.S. Cl.
CPC ........ *G05B 19/188* (2013.01); *C23C 16/4409* (2013.01); *C23C 16/4412* (2013.01);
(Continued)

(58) Field of Classification Search
None
See application file for complete search history.

(56) References Cited

U.S. PATENT DOCUMENTS 10,141,210 B2 11/2018 Oh et al.
2005/0069420 A1* 3/2005 Miyajima ......... H01L 21/67017
417/53
(Continued)

FOREIGN PATENT DOCUMENTS

JP 2000-340641 A 12/2000
JP 4516966 B 5/2010
(Continued)

OTHER PUBLICATIONS

Korean Office Action dated Feb. 28, 2020 for the Korean Patent Application No. 10-2018-0110803.

*Primary Examiner* — Kenneth M Lo
*Assistant Examiner* — Istiaque Ahmed
(74) *Attorney, Agent, or Firm* — Volpe Koenig (57) ABSTRACT

A technique is capable of preventing particles from adhering onto a wafer when a lid is attached or detached from a pod. A substrate processing apparatus includes: a placement part whereon a substrate container is placed; a guide part constituting a lid opening/closing space; a gate part separating the lid opening/closing space from a transfer chamber; a lid opening/closing mechanism provided in the lid opening/closing space and configured to attach or detach a lid of the substrate container; a gas introduction mechanism configured to supply a gas into the substrate container; a monitor part configured to monitor and adjust an inner pressure of the substrate container; and a controller configured to: (i) control the lid opening/closing mechanism; and (ii) control the monitor part to maintain the inner pressure of the substrate container higher than an inner pressure of the lid opening/closing space while the lid opening/closing mechanism detaches the lid.

11 Claims, 9 Drawing Sheets

(51) Int. Cl.
*H01L 21/673* (2006.01)
*H01L 21/67* (2006.01)
*C23C 16/44* (2006.01)
*C23C 16/455* (2006.01)

(52) U.S. Cl.
CPC .. *C23C 16/45557* (2013.01); *H01L 21/67017* (2013.01); *H01L 21/67376* (2013.01); *H01L 21/67389* (2013.01); *H01L 21/67393* (2013.01); *H01L 21/67769* (2013.01); *H01L 21/67772* (2013.01); *H01L 21/67781* (2013.01); *G05B 2219/45031* (2013.01)

(56) References Cited

U.S. PATENT DOCUMENTS

| | | | | |
|---|---|---|---|---|
| 2008/0236487 | A1* | 10/2008 | Hirano | H01L 21/67772 |
| | | | | 118/715 |
| 2009/0035099 | A1* | 2/2009 | Okabe | H01L 21/67772 |
| | | | | 414/217 |
| 2012/0289058 | A1 | 11/2012 | Hirano et al. | |
| 2014/0271053 | A1* | 9/2014 | Chen | H01L 21/67201 |
| | | | | 414/217.1 |
| 2015/0221538 | A1 | 8/2015 | Ochiai et al. | |
| 2016/0260627 | A1* | 9/2016 | Nakano | H01L 21/67772 |
| 2017/0025290 | A1* | 1/2017 | Wakabayashi | H01L 21/67772 |
| 2018/0254209 | A1* | 9/2018 | Kawai | H01L 21/67389 |
| 2019/0252228 | A1 | 8/2019 | Ochiai et al. | |

FOREIGN PATENT DOCUMENTS

| | | |
|---|---|---|
| JP | 2015-029057 A | 2/2015 |
| KR | 10-2007-0049207 A | 5/2007 |
| KR | 10-2015-0091230 A | 8/2015 |
| KR | 10-1593386 B1 | 2/2016 |

* cited by examiner

SUBSTRATE PROCESSING APPARATUS

CROSS-REFERENCE TO RELATED PATENT APPLICATION

This non-provisional U.S. patent application claims priority under 35 U.S.C. § 119 of Japanese Patent Application No. 2017-184691, filed on Sep. 26, 2017, in the Japanese Patent Office, and Japanese Patent Application No. 2018-158159, filed on Aug. 27, 2018, in the Japanese Patent Office, the entire contents of which are hereby incorporated by reference.

BACKGROUND

1. Field

The present invention relates to a substrate processing apparatus.

2. Description of the Related Art

Conventionally, an inert gas is supplied to a FOUP (Front Opening Unified Pod) (hereinafter, referred to as a "pod"). For example, according to the related art, the inert gas is supplied into a pod. For example, according to another related art, the inert gas is supplied into the pod and the flow rate of the supplied inert gas is monitored.

Then, in order to prevent adhesion of a natural oxide filial and adhesion of a gas in the pod, an inner atmosphere of the pod is replaced by supplying the inert gas. However, it is impossible to prevent particles generated during operation of a pod opening/closing mechanism from adhering to a substrate thereinafter, referred to as a "wafer").

SUMMARY

Described herein is a technique capable of preventing particles from adhering onto a wafer when a lid of a pod is attached to the pod or detached from the pod.

According to one aspect of the technique described herein, there is provided a substrate processing apparatus including: a placement part whereon a substrate container accommodating substrates is placed: a guide part constituting a lid opening/closing space where a lid of the substrate container is attached or detached; a gate part separating the lid opening/closing space from a transfer chamber, wherein the substrates are transferred between the substrate container and a substrate retainer configured to accommodate the substrates via the transfer chamber; a lid opening/closing mechanism provided in the lid opening/closing space and configured to attach the lid of the substrate container to the substrate container and detach the lid of the substrate container from the substrate container; a gas introduction mechanism configured to supply a gas into the substrate container placed on the placement part a monitor part configured to monitor and adjust an inner pressure of the substrate container by controlling the gas introduction mechanism; and a controller configured to: (i) control the lid opening/closing mechanism to attach or detach the lid; and (ii) control the monitor part to maintain the inner pressure of the substrate, container higher than an inner pressure of the lid opening/closing space while the lid opening/closing mechanism detaches the lid.

DETAILED DESCRIPTION

Embodiment

Hereinafter, an embodiment will be described.

(1) Configuration of Substrate Processing Apparatus

Hereinafter, a substrate processing apparatus 100 according to the embodiment will be described with reference to FIGS. 1 and 2.

Figure 1:
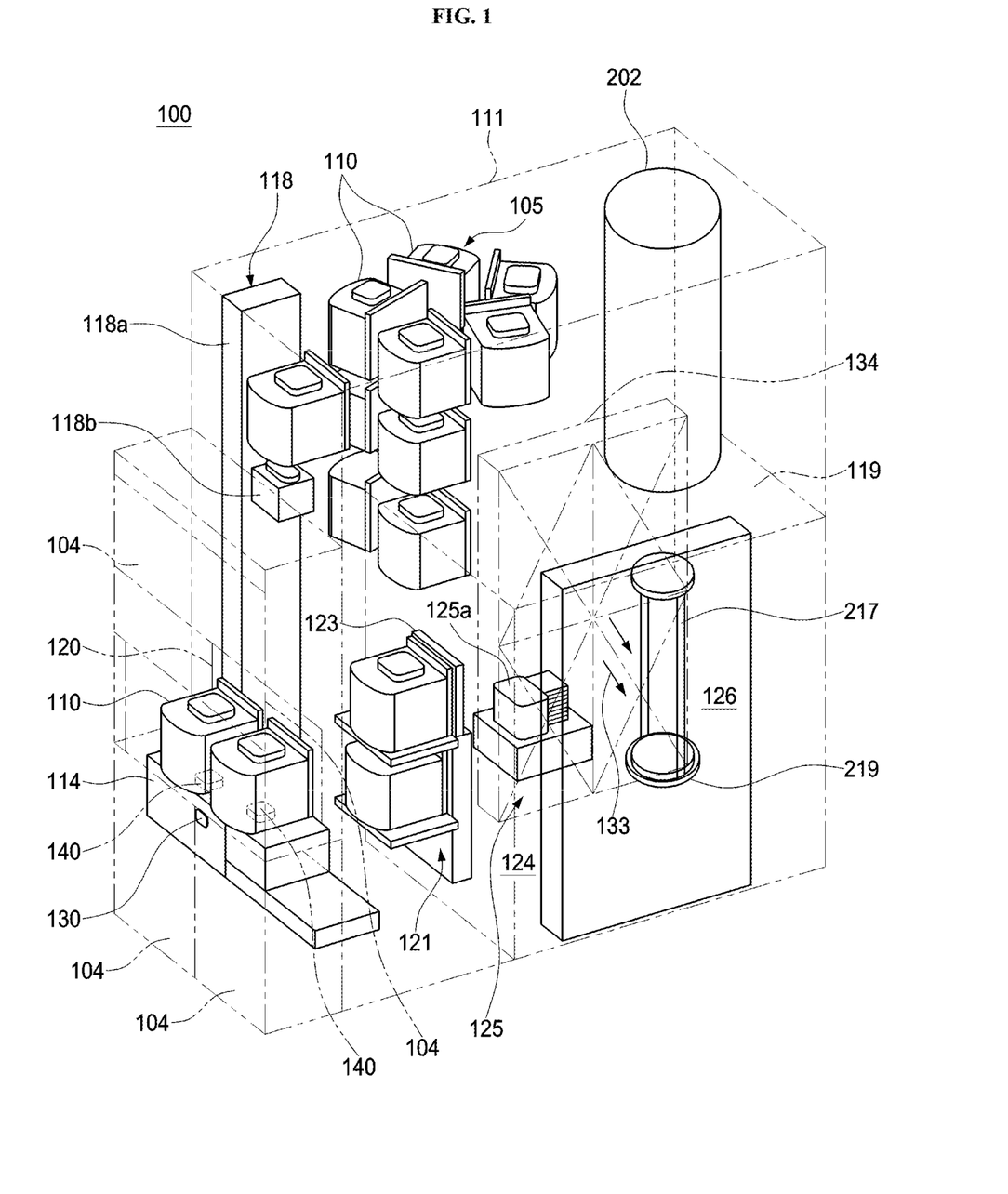
FIG. 1 schematically illustrates a perspective view of a substrate processing apparatus according to an embodiment.
Figure 2:
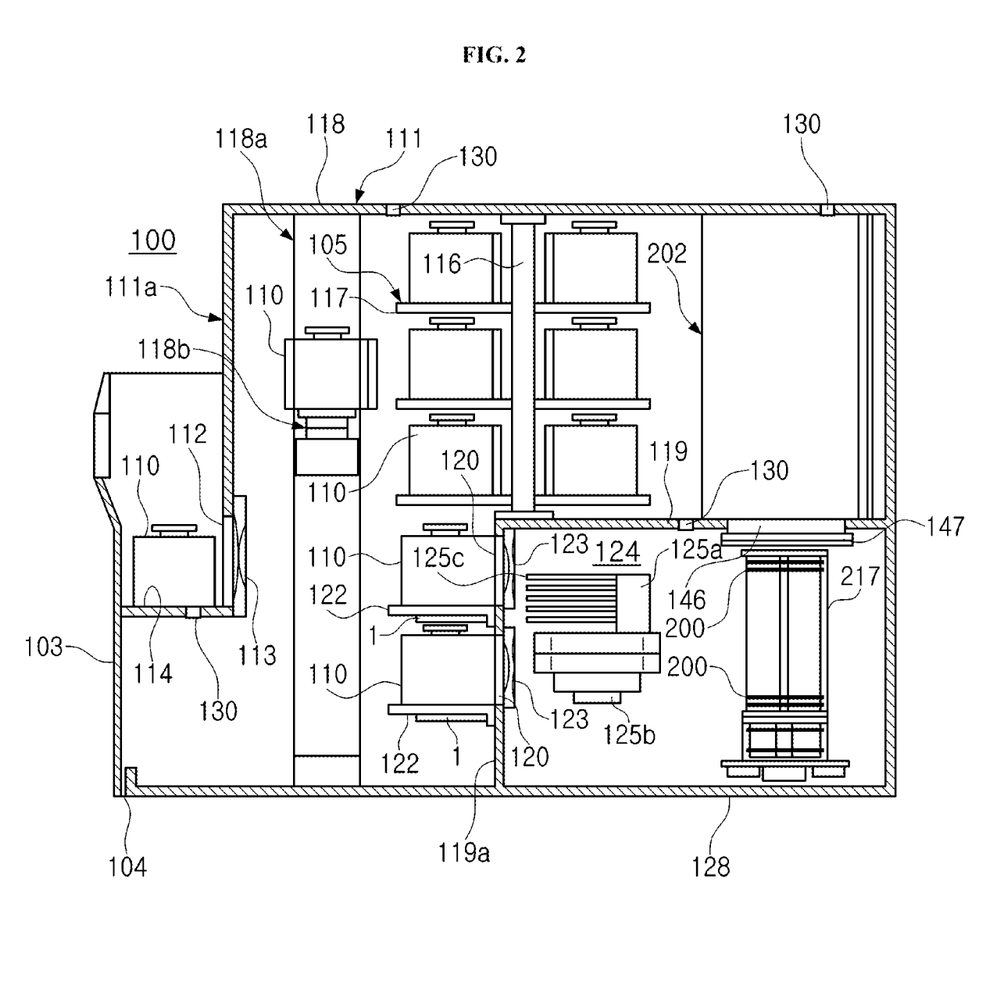
FIG. 2 schematically illustrates another perspective view of the substrate processing apparatus according to the embodiment.

As shown in FIGS. 1 and 2, the substrate processing apparatus 100 includes a housing 111 configured as a pressure resistant container. An opening portion 103 is provided at a lower front side of a front wall 111a of the housing 111 in order to maintain the substrate processing apparatus 100. A pair of front doors 104 is provided at the opening portion 103. The pair of front doors 104 serves as an opening/closing mechanism configured to open or close the opening portion 103. A pod 110 serving as, a substrate container accommodating wafers (substrates) 200 such as silicon wafers. The pod 110 is used as a carrier for transferring the wafers 200 into or out of the housing 111.

A pod loading/unloading port 112 is provided at the front wall 111a of the housing 111 for loading and unloading the pod 110 into and from the housing 111. The pod loading/unloading port 112 is opened or closed by a front shutter 113. A loading port shelf 114 is provided at a front side of the pod loading/unloading port 112. The pod 110 is aligned while placed on the loading port shelf 114.

A rotatable pod shelf 105 is provided over the substantially center portion of the housing 111. The rotatable pod shelf 105 may hold a plurality of pods 110. The rotatable pod shelf 105 includes a vertical column 116 capable of rotating horizontally and a plurality of shelf plates 117 provided at an upper end portion, a mid portion and a lower end portion of the vertical column 16 in the radial direction. The plurality of shelf plates 117 is configured to support the plurality of pods 110 while the plurality of pods 110 is placed thereon.

A pod transfer device 118 serving as a first transfer device is provided between the loading port shelf 114 and the rotatable pod shelf 105 in the housing 111. The pod transfer device 118 includes a pod elevator 118a capable of elevating and lowering while supporting the pod 110; and a pod transfer mechanism 118b. The pod transfer device 118 transfers the pod 110 among the loading port shelf 114, the rotatable pod shelf 105 and a placement part 122 serving as placement tables by consecutive operations of the pod elevator 118a and the pod transfer mechanism 118b.

A sub-housing 119 is provided below the substantially center portion in the housing 111 toward a rear end of the housing 111. The placement pan 122 configured to place the pod 110 thereon is provided at the front wall 119a of the sub-housing 119. For example, the placement part 122 includes an upper placement table and a lower placement table, as shown in FIG. 2. When the wafers 200 are transferred into or out of the sub-housing 119, the wafers 200 are accommodated in the pod 110. The stab-housing 119 defines a transfer chamber 124 fluidically isolated from the space in which the pod transfer device 118 or the rotatable pod shelf 105 is provided.

A lid opening/closing system described later at least includes: a partition part 121 (hereinafter also referred to as a "guide part") that partitions the transfer chamber 124 and a lid opening/closing space 124a described later; the placement part 122 where the pod 110 is placed thereon; and a cap attaching detaching mechanism 123 (hereinafter also referred to as a "lid opening/closing mechanism") serving as a pod opener configured to attach or detach (i.e. close or open) a lid (cap) 120 serving as a lid of the pod 110. The lid opening/closing system is provided with a panel 121a serving as a gate part described later.

In the embodiment, the placement part 122 is provided with a gas introduction mechanism 1 serving as a mechanism configured to eject an inert gas to an inside of the pod 110. The gas introduction mechanism 1 will be described later in detail. An exhaust mechanism indicated by "VENT" in FIGS. 7A through 7F, which will be described later, is provided on the front wall 119a for exhausting an inner atmosphere of the lid opening/closing space 124a described later. That is, the exhaust mechanism is provided in the vicinity of the lid opening/closing space 124a. The lid opening/closing system may further include the gas introduction mechanism 1 and the exhaust mechanism indicated by "VENT" in FIGS. 7A through 7F.

A wafer transport mechanism 125 serving as a transport device is provided at a front portion of the transfer chamber 124. The wafer transport mechanism 125 includes a wafer transport device 125a and a wafer transport device elevator 125b. The wafer transport device 125a is capable of horizontally rotating or moving the wafer 200. The wafer transport device elevator 125b is capable of elevating or lowering the wafer transport device 125a. The wafer transport device elevator 125b is provided between a right end of the front portion of the transfer chamber 124 of the sub-housing 119 and a right side end of the housing 111. The wafer transport device 125a is further includes tweezers 125c serving as a substrate holder capable of supporting the wafer 200. The wafer transport mechanism 125 is configured to charge or discharge the wafers 200 into or from a boat 217 by consecutive operations of the wafer transport device elevator 125b and the wafer transport device 125a. The boat 217 is also referred to as a substrate retainer 217. Charging and discharging of the wafers 200 will be described later in detail.

As shown in FIG. 2, a process furnace 202 is provided above a standby space 126 where the boat 217 is accommodated and in standby. A lower end of the process furnace 202 may be opened or closed by a furnace opening shutter 147.

Figure 3:
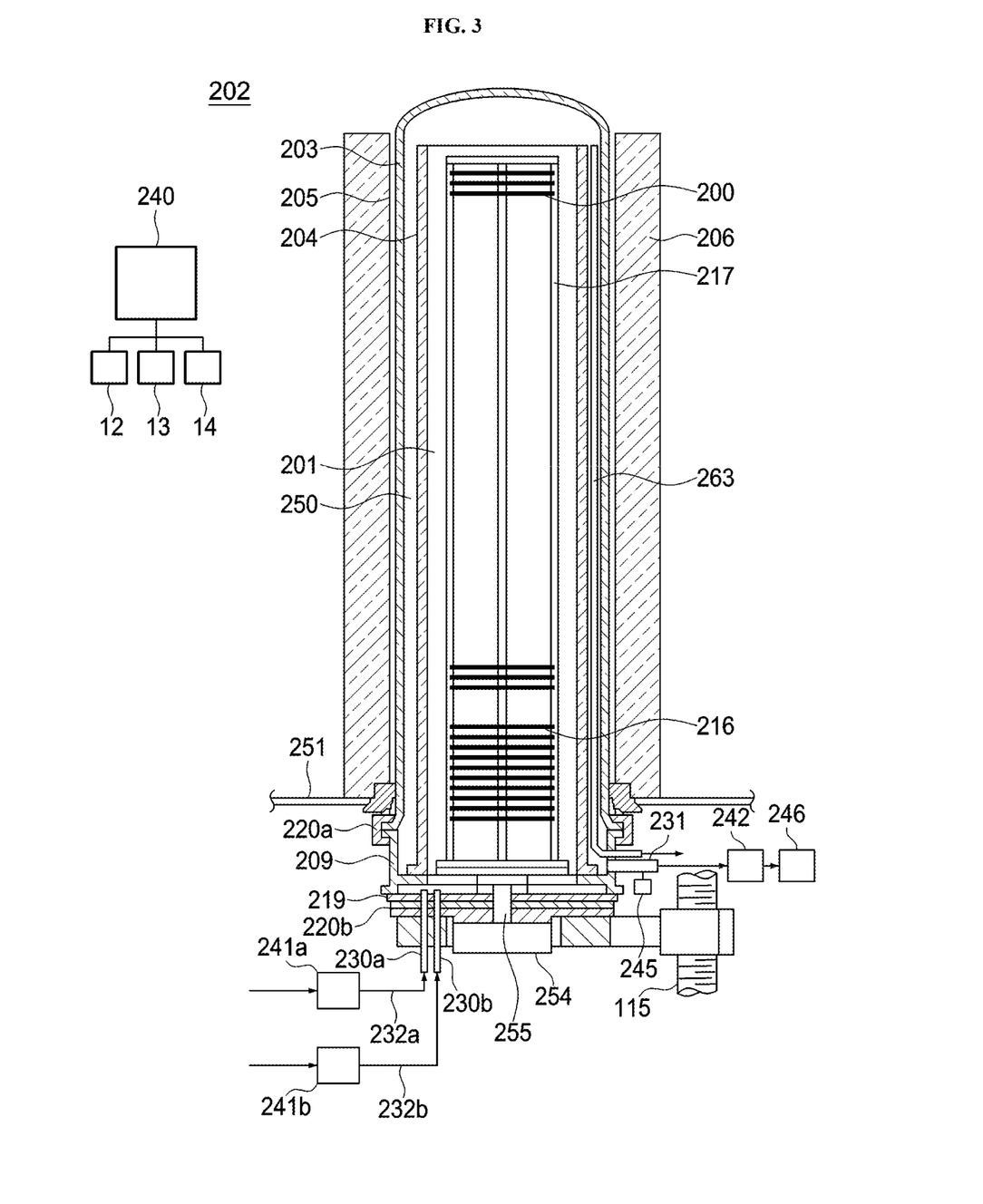
FIG. 3 schematically illustrates a vertical cross-section of a process furnace of the substrate processing apparatus according to the embodiment.

As shown in FIGS. 1 and 3, a boat elevator 115 is provided in the transfer chamber 124. The boat elevator 115 elevates or lowers the boat 217. An arm 128 is connected to an elevating table (not shown) of the boat elevator 115. A seal cap 219 is provided horizontally at the arm 128. The seal cap 219 is configured to support the boat 217 vertically and close the lower end of the process furnace 202.

A transfer mechanism according to the embodiment is mainly constituted by the rotatable pod shelf 105, the boat elevator 115, the pod transfer device 118, the wafer transport mechanism 125, the boat 217 and the lid opening/closing mechanism 123. The rotatable pod shelf 105, the boat elevator 115, the pod transfer device 118, the wafer transport mechanism 125, the boat 217 and the lid opening/closing mechanism 123 are electrically connected to a transfer controller 27 described later.

The boat 217 includes a plurality of support parts. The boat 217 is configured to support the wafers 200 which are concentrically arranged in the vertical direction while each of the wafers 200 is horizontally oriented.

(2) Configuration of Process Furnace

Hereinafter, a configuration of the process furnace 202 according to the embodiment will be described with reference to FIG. 3.

As shown in FIG. 3, the process furnace 202 includes a process tube 203 serving as a reaction tube. The process tube 203 includes an inner reaction tube 204 serving as an inner tube and an outer reaction tube 205 serving as an outer tube and provided outside the inner reaction tube 204. The inner reaction tube 204 is cylindrical with open upper and lower ends. A process chamber 201 wherein the wafers 200 serving as substrates are processed is provided in a hollow portion of the inner reaction tube 204. The process chamber 201 is configured to accommodate the boat 217 described later. The outer reaction tube 205 is provided concentrically with the inner reaction tube 204. The inner diameter of the outer reaction tube 205 is larger than the outer diameter of the inner reaction tube 204. The outer reaction tube 205 is cylindrical with a closed upper end and an open lower end.

A heater 206 serving as a heating mechanism is provided at the outside of the process tube 203 to surround the side wall of the process tube 203. The heater 206 is cylindrical. The heater 206 is vertically supported by a heater base 251 serving as a support plate.

A manifold 209 is provided under the Outer reaction tube 205. The reaction tube 205 and the manifold 209 are concentrically arranged. The manifold 209 is cylindrical with open upper and lower ends. The manifold 209 vertically supports the lower end of the inner reaction tube 204 and the lower end of the outer reaction tube 205. The manifold 209 engages with the lower end of the inner reaction tube 204 and the lower end of the outer reaction tube 205, respectively. A sealing member such as an O-ring 220a is provided between the manifold 209 and the outer reaction tube 205. The process tube 203 is vertically supported by the heater base 251 under the manifold 209. A reaction vessel is constituted by the process tube 203 and the manifold 209.

A process gas nozzle 230a and a purge gas nozzle 230b are connected to the seal cap 219 described later to communicate with the process chamber 204. A process, gas supply pipe 232a is connected to the process gas nozzle 230a. Components such as a process gas supply source (not shown) are connected to the upstream side of the process gas supply pipe 232a (i.e., the side opposite to where the process gas nozzle 230a is connected) through a mass flow controller 241a serving as a gas flow rate controller. Hereinafter, "mass flow controller" is referred to as a "MFC". A purge gas supply pipe 232b is connected to the purge gas nozzle 230b. Components such as the purge gas supply source (not shown) are connected to the upstream side of the purge gas supply pipe 232b (i.e., the side opposite to where the purge gas nozzle 230b is connected) through an MFC 241b. A gas supply controller 14 is electrically connected to the MFCs 241a and 241b.

An exhaust pipe 231 configured to exhaust an inner atmosphere of the process chamber 201 is provided at the manifold 209. The exhaust pipe 231 is disposed at a lower end of a cylindrical space 250 which is a gap between the inner reaction tube 204 and the outer reaction tube 205. The exhaust pipe 231 is spatially connected to the cylindrical space 250. A pressure sensor 245, a pressure adjusting device 242 such as an APC (Automatic Pressure Controller) and an exhaust device 246 such as a vacuum pump are sequentially installed at the exhaust pipe 231 from the upstream side, to the downstream side of the exhaust pipe 231. A pressure controller 13 is electrically connected to the pressure adjusting device 242 and the pressure sensor 245.

The seal cap 219 capable of sealing the manifold 209 in airtight manner is provided under the manifold 209. The seal cap 219 is in contact with the lower end of the manifold 209 from thereunder. The seal cap 219 is disk-shaped. An O-ring 220b, serving as a sealing member and being in contact with the lower end of the manifold 209, is provided on an upper surface of the seal cap 219.

A rotating mechanism 254 configured to rotate the boat 217 is provided about a center portion of the seal cap 219 opposite to the process chamber 201. The rotating mechanism 254 is capable of rotating the wafers 200 by rotating the boat 217. A rotating shaft 255 of the rotating mechanism 254 is connected to the boat 217 through the seal cap 219 and supports the boat 217 from thereunder. Insulating plates 216 serving as an insulating pan are provided under the boat 217. The insulating plates 216 are concentrically arranged in the vertical direction and in horizontal orientation. The insulating plates 216 are disk-shaped.

The seal cap 219 may be moved upward/downward in the vertical direction by the boat elevator 115 installed outside the process tube 203. When the seal cap 219 is moved upward/downward by the boat elevator 115, the boat 217 may be loaded into the process chamber 201 or unloaded out of the process chamber 201. A transfer controller 27 is electrically connected to the rotating mechanism 254 and the boat elevator 115.

A temperature sensor 263 serving as a temperature detector is provided m the process tube 203. A heating mechanism according to the embodiment is constituted by the heater 206 and the temperature sensor 263. A temperature controller 12 is electrically connected to the heater 206 and the temperature sensor 263.

(3) Operation of Process Furnace

Hereinafter, a method of funning a film on the wafers 200 using the process furnace 202, which is one of processes for manufacturing semiconductor device, will be described with reference to FIG. 3 based on an exemplary sequence of funning a film on the wafers 200. In the description below, a controller 240 configured to control the substrate processing apparatus 100 controls the operations of the components of the substrate processing apparatus 100.

After the wafers 200 are charged into the boat 217 (wafer charging), the boat 217 charged with the wafers 200 is elevated by the boat elevator 115 and loaded into the process chamber 201 (boat loading). Then, the seal cap 219 seals the lower end of the manifold 209 via the O-ring 220b.

The exhaust device 246 vacuum-exhausts the process chamber 201 such that an inner pressure of the process chamber 201 is at desired pressure (vacuum level). The inner pressure of the process chamber 201 is measured by the pressure sensor 245, and the pressure adjusting device 242 is feedback-controlled based on the measured pressure. That is, the opening degree of a valve of the pressure adjusting device 242 is feedback-controlled. The heater 206 heats the process chamber 201 such that the temperature of the wafers 200 in the process chamber 201 reaches and is maintained at a desired temperature. The amount of current supplied to the heater 206 is feedback-controlled based on the temperature, detected by the temperature sensor 263. Thereafter, the boat 217 and the wafers 200 are rotated by the rotating mechanism 254.

Next, a process gas is supplied from the process gas supply source (not shown). The process gas having the flow rate thereof adjusted by the MFC 241a is supplied into the process chamber 201 through the process gas supply pipe 232a and the process gas nozzle 230a. The process gas supplied into the process chamber 201 rises in the process chamber 201 and flows into the cylindrical space 250 through an opening portion at the upper end of the inner reaction tube 204, and is exhausted through the exhaust pipe 231. The process gas contacts the surfaces of the wafers 200 as it passes through the process chamber 201, whereby a film is deposited on the surfaces of the wafers 200 by thermal reaction.

After a predetermined processing time, elapses, a purge gas is supplied from the purge gas supply source (not shown). The purge gas having the flow rate thereof adjusted by the MFC 241b is supplied into the process chamber 201. The inner atmosphere of the process chamber 201 is replaced with the inert gas, and the inner pressure of the process chamber 201 is returned to a normal pressure.

Thereafter, the seal cap 219 is lowered by the boat elevator 115 and the lower end of the manifold 209 is opened. The processed wafers 200 are transported out of the process tube 203 through the lower end of the manifold 209 while being supported by the boat 217 (boat unloading). The processed wafers 200 are then discharged from the boat 217 and stored in the pod 110 (wafer discharging).

(4) Configuration of the Controller

Figure 4:
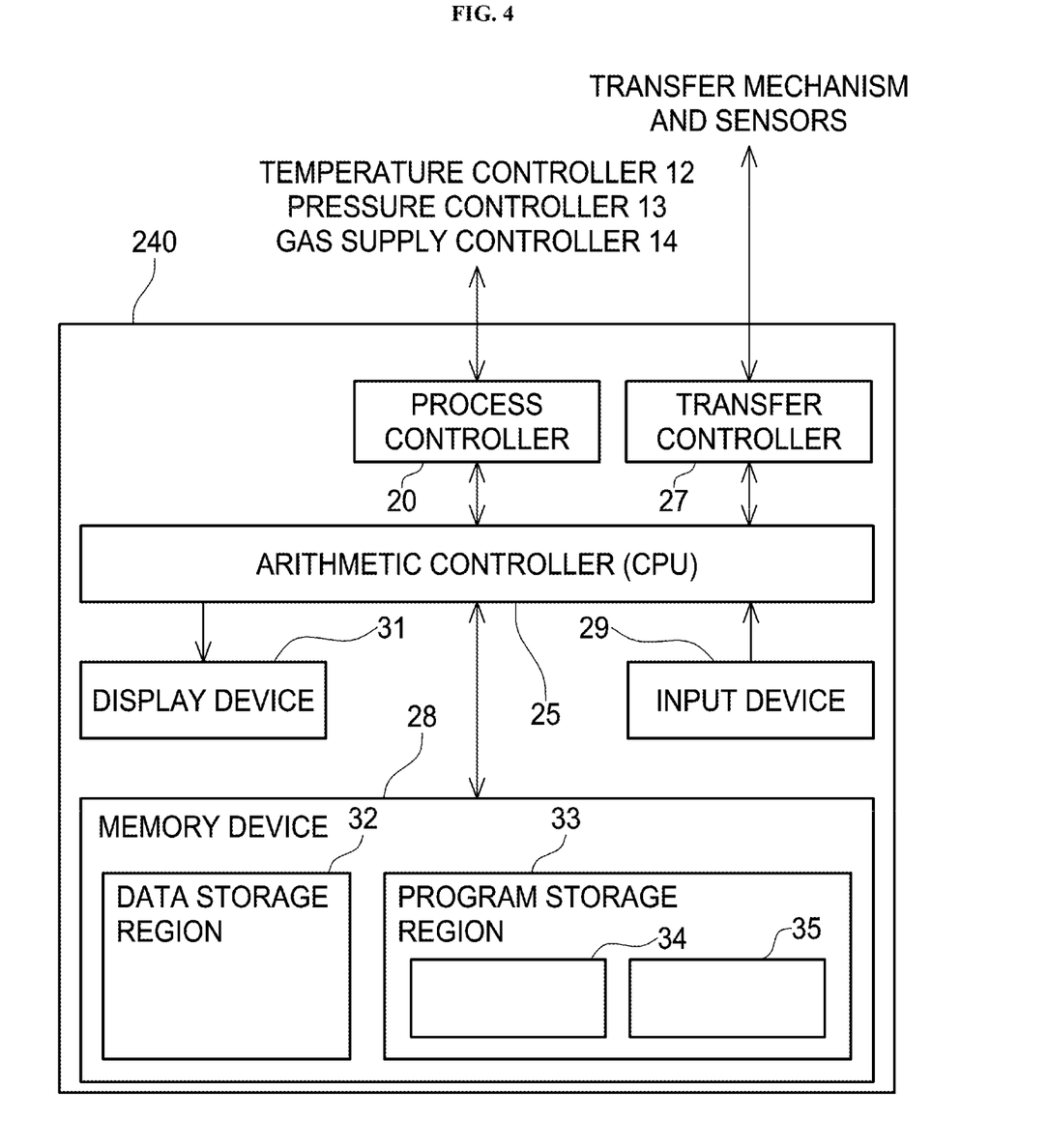
FIG. 4 schematically illustrates a controller of the substrate processing apparatus according to the embodiment.

The controller 240 configured to control the substrate processing 100 will be described with reference to FIG. 4. Hereinafter, the controller 240 configured to control the substrate processing 100 is simply referred to as the controller 240.

The controller 240 mainly includes a CPU (Central Processing Unit) 25 serving as an arithmetic controller, a process controller 20 serving as a process control device, the transfer controller 27, a memory device 28 having a memory (ROM) 35 and a memory (RAM), an input device 29 such as a mouse and a keyboard and a display device 31 such as a monitor. The memory device 28 may further have a hard disk drive (HDD). The CPU 25, the memory device 28, the input device 29 and the display device 31 constitute an operation device capable of setting respective data.

The CPU 25 forms a backbone of the controller 240. The CPU 25 is configured to execute a control program stored in the ROM 35 and a recipe (such as a process recipe serving as a substrate processing recipe) stored in the memory device 28 functioning as a recipe storage device according to an instruction from the display device 31. The ROM 35 is a recording medium for storing data such as an operating system for the CPU 25, and may be embodied by components such as an EEPROM, a flash memory and a hard disk. The memory (RAM) functions as a work area (temporary storage device) of the CPU 25.

In the embodiment, "substrate processing recipe" refers to a recipe in which information such as processing conditions and processing sequences for processing the wafers 200 is stored. Information such as a pre-set value (control value) or a transmission timing to be transmitted to components such as, the transfer controller 27, the temperature controller 12, the pressure controller 13 and the gas supply controller 14 is stored in the recipe, for each step of the substrate processing. The recipe is also referred to as a "recipe file".

The process controller 20 is configured to control parameters such as an inner temperature and an inner pressure of the process furnace 202 and the flow rate of the process gas supplied into the process furnace 202 in order to process the wafers 200 loaded in the process furnace 202.

The transfer controller 27 is configured to control the operation of the transfer mechanism configured to transfer the wafers 200 such as the rotatable pod shelf 105, the boat elevator 115, the pod transfer device 118, the wafer transport mechanism 125 and the rotating, mechanism 254. For example, the transfer controller 27 is configured to perform transfer operations of the rotatable pod shelf 105, the boat elevator 115, the pod transfer device 118, the substrate transport mechanism 125, the boat 217 and the rotating mechanism 254.

The memory device 28 has a data storage region 32 where various data is stored and a program storage region 33 where various programs such as the substrate processing recipe are stored.

Various parameters related to the recipe file are stored in the data storage region 32. Carrier information including at least the carrier ID of the pod 110 and the type information of the wafers 200 in the pod 110 is stored in the data storage region 32. The carrier ID refers to information to identify the pod 110. Various programs such as the substrate processing recipe required for controlling the operation of the substrate processing apparatus 100 are stored in the program storage region 33. A lid opening/closing control program described later is stored in the program storage region 33.

A touch panel is provided in the display device 31 of the controller 240. The touch panel is configured to display an operation screen configured to receive input of an operation command for operating the substrate processing apparatus 100. The operation screen includes various display fields and operation buttons for confirming the state of the substrate processing apparatus 100 and for inputting operation instructions to the substrate processing apparatus 100. The operation device described above preferably includes at least the display device 31 and the input device 29. The operation device may be, for example, an operating terminal device such as a computer and a mobile terminal device.

The temperature controller 12 is configured to adjust the inner temperature of the process furnace 202 by controlling the temperature of the heater 206 of the process furnace 202. The temperature controller 12 is also configured to notify the controller 240 of the values detected by the temperature sensor 263 when a predetermined value and an abnormal value are detected by the temperature sensor 263.

The pressure controller 13 is configured to control the pressure adjusting device 242 based on the pressure detected by the pressure sensor 245 such that the inner pressure of the process chamber 201 is at a desired pressure at desired timing. The controller 240 is, also configured to notify the controller 240 of the values detected by the pressure sensor 245 when a predetermined value and an abnormal value are detected by the pressure sensor 245. The pressure controller 13 controls an adjustment part of the gas introduction mechanism 1 described later in order to adjust an inner pressure of the pod 110. Specifically, the pressure controller 13 controls a pressure adjusting device 7 of the gas introduction mechanism 1 based on the pressure detected by a pressure sensor 8 described later such that the inner pressure of the pod 110 is at a desired pressure at desired timing. The pressure controller 13 is configured to monitor the inner pressure of the pod 110 and an inner pressures of the transfer chamber 124 (i.e., an inner pressure of the lid opening/closing space 124a), and is configured to adjust the inner pressure of the pod 110 and the pressure of the transfer chamber 124. Hereinafter, the pressure controller 13 is also referred to as a monitor part 13 configured to monitor the pressure.

The gas supply controller 14 is configured to control the MFCs 241a and 241b such that the flow rate of the gas supplied into the process chamber 201 is at a desired flow rate at desired timing. The gas supply controller 14 is also configured to control the gas introduction mechanism 1 described later such that the flow rate of the gas supplied to the pod 110 by the gas introduction mechanism 1 is at desired flow rate.

(5) Gas Introduction Mechanism

The gas introduction mechanism 1 according to the embodiment will be described with reference to FIGS. 5 and 6.

Figure 5:
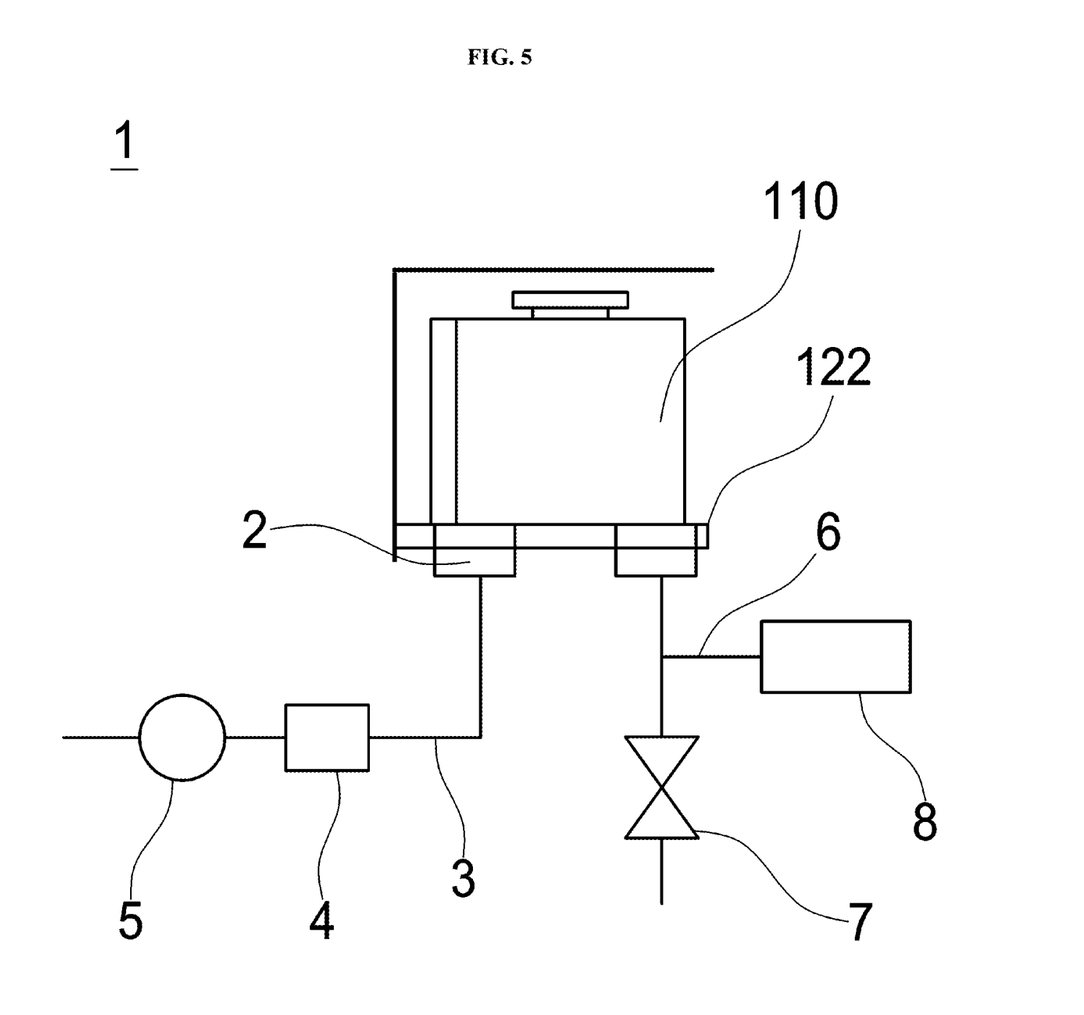
FIG. 5 schematically illustrates a gas introduction mechanism of the substrate processing apparatus according to the embodiment.
Figure 6A:
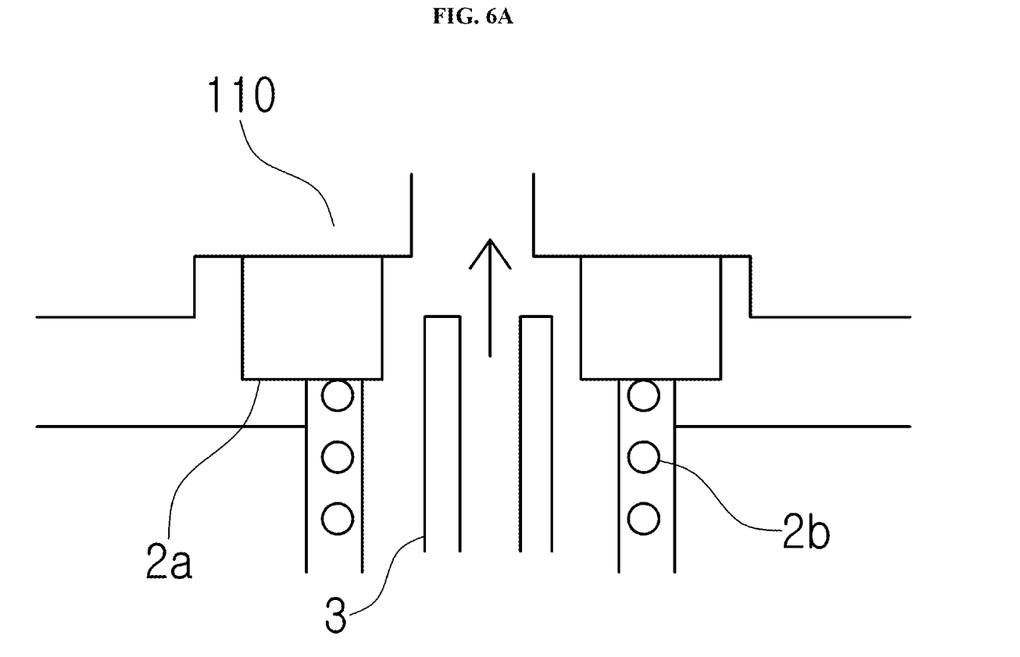
FIG. 6A schematically illustrates a sealing part of the gas introduction mechanism according to the embodiment.

As shown in FIG. 5, the gas introduction mechanism 1 includes: a flow rate controller 4 configured to control the flow rate of the gas; a gas pipe 3 serving as a gas supply pipe constituting a gas flow path; a sealing part 2 including a gas introduction part configured to introduce the gas to the pod 110; and the adjustment part configured to adjust the inner pressure of the pod 110. The gas induction mechanism 1 is configured to maintain the inner pressure of the pod 110 to a predetermined pressure or a pressure higher than the predetermined pressure by the monitor part 13.

As described above, the placement part 122 is provided with the gas introduction mechanism 1 serving as the mechanism for ejecting the inert gas to the inside of the pod 110. The inert gas is flow to the inside of the pod 110. The gas introduction mechanism 1 is provided with the sealing part 2. The sealing part 2 is provided so that the gas pipe 3 communicates with the inside of the pod 110 when the pod 110 is transferred to the placement pan 122.

An inert gas supply source (not shown) is connected to the upstream side of the gas pipe serving as a nozzle via a flow rate meter 4 and a valve 5. The flow rate meter 4 and the valve 5 serve as a gas flow rate controller, and are electrically connected to the monitor part 13. The monitor part 13 is configured to control the flow rate meter 4 and the valve 5 such that the flow rate of the gas supplied into the pod 110 is at a desired flow rate at a desired timing.

A gas pipe 6 configured to exhaust the inner atmosphere of the pod 110 is provided at the downstream side of the gas pipe 3. The pressure sensor 8 serving as a pressure detector for detecting, the inner pressure of the pod 110 and the pressure adjusting device 7 of the pod 110 are configured to operate such that the inner pressure of the pod 110 is at a predetermined pressure. The pressure sensor 8 and the pressure adjusting device 7 are collectively referred to as the adjustment part. The adjustment part is controlled by the adjustment part 13.

Next, the sealing part 2 will be described in detail with reference to FIGS. 6A and 6B. As shown in FIG. 6A a periphery of the gas pipe 3 serving as the nozzle is constituted by a sealing material 2a and a component part 2b serving as a holding part for holding the sealing material 2a so as not to leak the inert gas. Thereby, a space between the gas pipe 3 and the pod 110 can be hermetically sealed by the component part 2b that holds the sealing material 2a. Thus, even if there is a difference in height, shape and material of an inert gas inlet of the pod 110, it is possible to introduce the inert gas into the pod 110 without the leakage of the inert gas to the outside.

The component part 2b of the sealing part 2 is configured to support the sealing material 2a such that the sealing material 2a is in contact with a lower side of the pod 110. The component part 2b is made of a stretchable material such as a spring, for example. The sealing material 2a is pushed up through the lower side of the pod 110 by the expanding and contracting force of the stretchable material. For example, the sealing material 2a is an elastically deformable material such as rubber. For example, a packing or an O-ring is selected and used as the sealing material 2a. Thereby, it is possible to prevent the leakage of the gas by the elastic deformation (reaction force) and to hermetically seal the space between the gas pipe 3 serving as the nozzle and the pod 110.

Figure 6B:
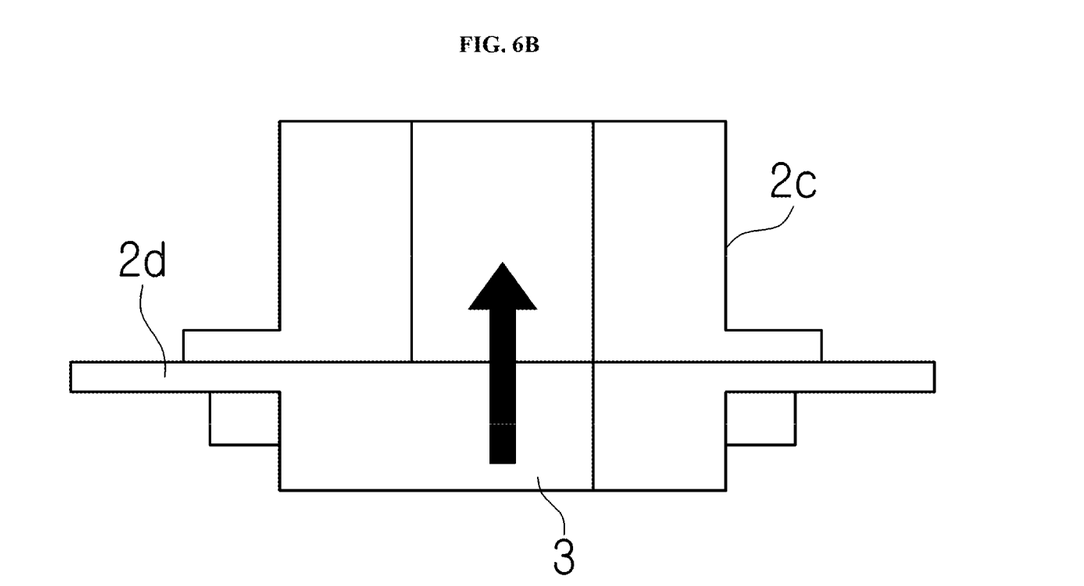
FIG. 6B schematically illustrates the sealing part of the gas introduction mechanism according to the embodiment.

Alternatively, as shown in FIG. 6B, a sealing material 2c may be pressed when the pod 110 is placed thereon. It is possible to hermetically seal the space between the gas pipe 3 serving as the nozzle and the pod 110 when the sealing material 2c is used. The sealing material 2c supported by a holding part 2d may be the same as that of the sealing material 2a. However, the sealing material 2c may be made of rubber having hardness lower than that of the sealing material 2a. Therefore, using soft shrinkage of the rubber, it is possible to maintain the airtightness between the gas pipe 3 serving as the nozzle and the pod 110 when the pod 110 is placed regardless of the configuration of the pod 110.

As described above, according to the embodiment, it is possible to pressurize the inside of the pod 110 to a positive pressure with the inert gas before opening (detaching) the lid 120 of the pod 110 (i.e., before the operation of the lid opening/closing mechanism 123). As a result, when the lid 120 of the pod 110 is opened (detached), it is possible to prevent particles generated by opening the lid 120 of the pod 110 from entering the pod 110. Thus, it is possible to prevent the particles from adhering to the wafers 200 accommodated in the pod 110.

(6) Lid Opening/Closing System

Hereinafter, an operation of opening (detaching) and closing (attaching) the lid 120 of the pod 110 by the lid opening/closing system will be described. The opening and closing of the lid 120 of the pod 110 is appropriately performed during charging of the wafers 200 into the boat 217 and discharging of the wafers 200 from the boat 217 by the wafer transport mechanism 125. FIGS. 7A through 7F schematically illustrate the operation of the lid opening/closing system in a wafer charging step (i.e., a lid opening/closing operation), that is, when the wafers 200 are charged into the boat 217. FIGS. 7A through 7F will be collectively referred to as "FIG. 7" hereinafter.

First, referring to FIG. 7, the configuration of the lid opening/closing system will be described. The lid opening/closing system at least includes: the partition art 121 constituting the lid opening/closing space 124a between lid opening/closing system and the front wall 119a; the placement part 122 where the pod 110 is placed thereon; the lid opening/closing mechanism 123 configured to attach and detach the lid 120 of the pod 110; and the gate part 121a provided in the lid opening/closing space 24a. The lid opening/closing system may further include the gas introduction mechanism 1 and the exhaust mechanism indicated by "VENT" in FIG. 7. The gate part 121a will be described later in detail.

Figure 7A:
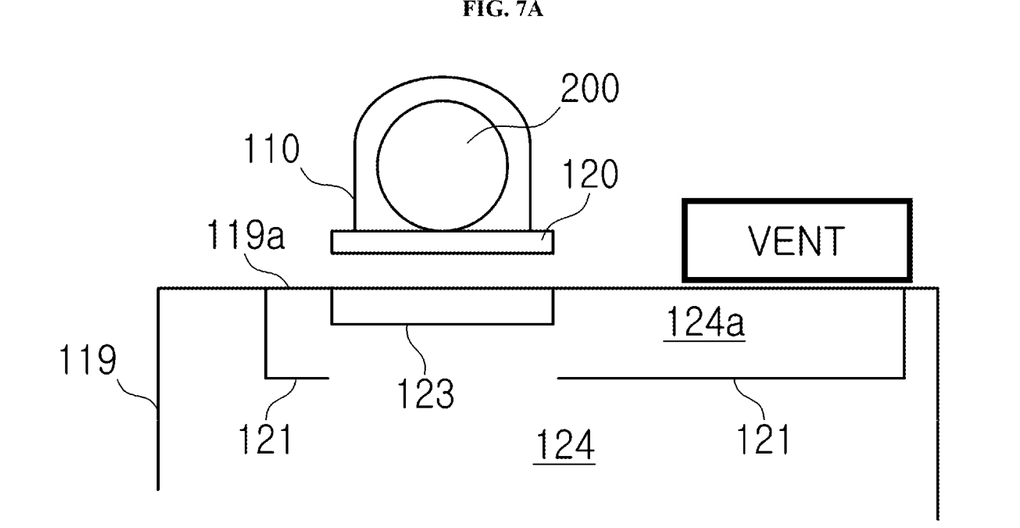
FIG. 7A schematically illustrates an operation of a lid opening closing system according to the embodiment.

FIG. 7A schematically illustrates the lid opening/closing operation of the lid opening/closing system when the pod 110 is placed on the placement part 122. In the embodiment, the controller 240 starts executing the lid opening/closing control program when the pod 110 is placed on the placement pan 122 as shown in FIG. 7A. The controller 240 controls the operations of the components constituting the lid opening/closing system.

When the pod 110 is placed on the placement part 122 as shown in FIG. 7A, the inert gas by the gas introduction mechanism 1 shown in FIG. 5 is supplied into the pod 110. Then, the inert gas is circulated the inside of the pod 110. The inner pressure of the pod 110 is controlled to a positive pressure higher than the pressure of the transfer chamber 124 (or a pressure of the lid opening/closing space 124a). In addition, the inner pressure of the pod 110 or the flow rate of the inert gas (purge gas) is set in advance appropriately. For example, according to the embodiment, the inner pressure of the pod 110 is set to twice the inner pressure of the transfer chamber 124.

Figure 7B:
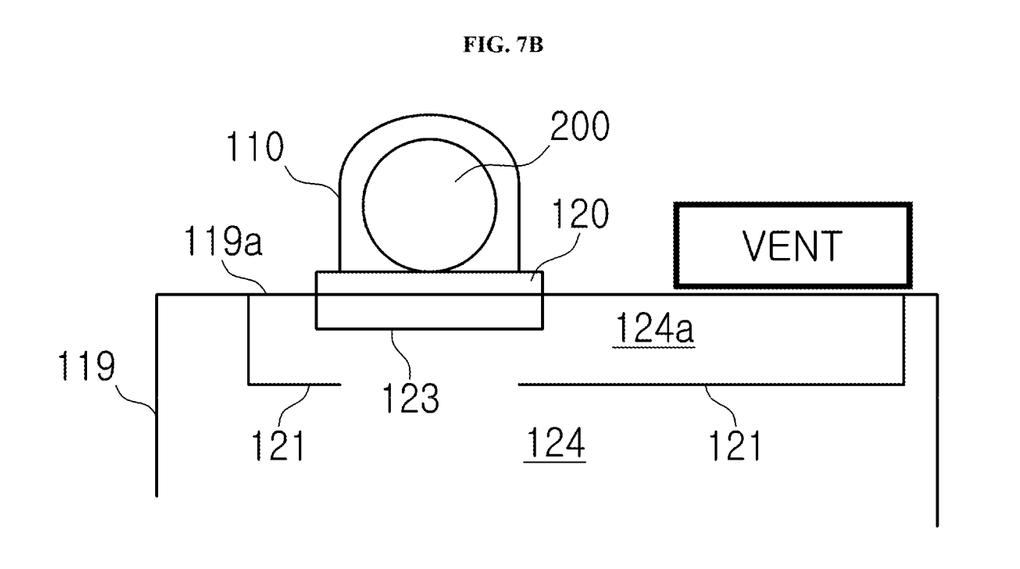
FIG. 7B schematically illustrates the operation of the lid opening closing system according to the embodiment.

FIG. 7B schematically illustrates the lid opening/closing operation of the lid opening/closing system when the lid 120 of the pod 110 is pressed against the lid opening/closing mechanism 123 and the lid 120 is attached to the lid opening/closing mechanism 123. The gas introduction mechanism 1 shown in FIG. 5 may supply the inert gas such as No gas into the pod 110 even after the lid 120 is pressed against the lid opening/closing mechanism 123 and attached to the lid opening/closing mechanism 123, as shown in FIGS. 7C through 7F. Therefore, it is possible to maintain the inner pressure of the pod 110 at a positive pressure.

Figure 7C:
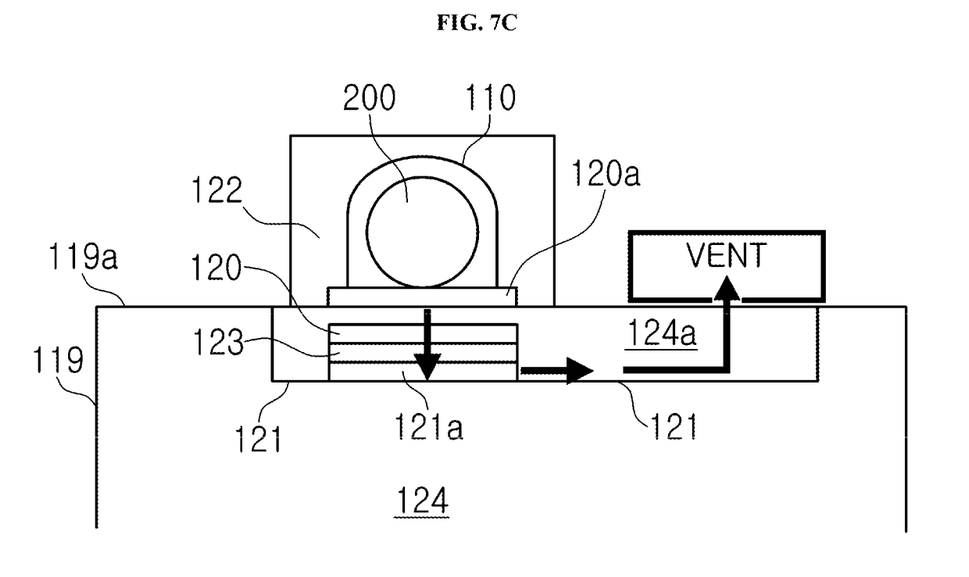
FIG. 7C schematically illustrates the operation of the lid opening/closing system according to the embodiment.

FIG. 7C schematically illustrates the lid opening/closing operation of the lid opening/closing system when the lid 120 is detached. By detaching or attaching the lid 120 of the pod 110 placed on the placement part 122 by the lid opening/closing mechanism 123, a wafer entrance 120a of the pod 110 is opened or closed. When the lid 120 is detached, the inner pressure of the pod 110 is maintained at a positive pressure. Thus, even if minute particles are generated by the operation of the lid opening/closing mechanism 123, it is possible to prevent the minute particles from entering the pod 110. For example, the inner pressure of the pod 110 is maintained at twice the inner pressure of the transfer chamber 124 (that is, the pressure of the lid opening/closing space 124a). As long as the entering of the minute particles into the pod 110 can be suppressed, the inner pressure of the pod 110 is not limited to twice the inner pressure of the transfer chamber 124 (that is, the pressure of the lid opening/closing space 124a). For example, the inner pressure of the pod 110 may be a positive pressure less than twice the inner pressure of the transfer chamber 124 (for example 1.1 times of the inner pressure of the transfer chamber 124) or may be a positive pressure greater than twice the inner pressure of the transfer chamber 124.

Further, in FIG. 7C, the space for transferring the wafers 200 in the transfer chamber 124 by the wafer transport mechanism 125 is closed by the gate part 121a. The controller 240 is configured to control the lid opening/closing mechanism 123 so that the lid 120 is detached from the pod 110 by the lid opening/closing mechanism 123, and to control the lid opening/closing mechanism 123 and the gate part 121a together so that the transfer chamber 124 is separated from the lid opening/closing space 124a. According to the embodiment, although the inner atmosphere of the pod 110 is replaced with the inert gas in advance, the inside of the pod 110 is in general in a high oxygen concentration state compared with the transfer chamber 124, and the transfer chamber 124 is in a low oxygen concentration (for example, 20 ppm or less) state. Thus, in order to prevent oxygen from flowing, into the transfer chamber 124, the transfer chamber 124 is separated from the lid opening/closing space 124a by an operation of the gate part 121a.

According to the embodiment, when the lid 120 is detached by the lid opening/closing mechanism 123, as described above, the inert gas is supplied to the inside of the pod 110 (or the pod 110 is filled with inert gas) so that the inner pressure of the pod 110 is higher than the pressure of the lid opening/closing space 124a. Thus, it is possible to prevent the minute particles generated by the operation of the lid opening/closing mechanism 123 from entering the pod 110. Further, when the lid 120 of the pod 110 is opened, by supplying the inert gas by the gas introduction mechanism 1 shown in FIG. 5 and by exhausting the pod 110 and the lid opening/closing space 124a by the exhaust mechanism indicated by "VENT" in FIG. 7, a flow path is formed so that the inert gas supplied into the pod 110 flows toward the exhaust mechanism indicated by "VENT" in FIG. 7, and the gas in the pod 110 and the inner atmosphere of the lid opening/closing space 124a are exhausted through the exhaust mechanism indicated by "VENT" in FIG. 7. Thereby, it is possible to suppress the minute particles generated by the operation of the lid opening/closing mechanism 123 from entering the pod 110.

Then, while the transfer chamber 124 and the lid opening/closing space 124a are separated, the inner atmosphere of the pod 110 and the inner atmosphere of the lid opening/closing space 124a are replaced with an $N_2$ atmosphere by continuously supplying the inert gas by the gas introduction mechanism 1 shown in FIG. 5 and by continuously exhausting the pod 110 and the lid opening/closing space 124a by the exhaust mechanism indicated by "VENT" in FIG. 7. The inner pressure of the pod 110 and the pressure of the lid opening/closing space 124a are maintained higher than the inner pressure of the transfer chamber 124 by continuously supplying the inert gas by the gas introduction, mechanism 1 shown in FIG. 5 and by continuously exhausting the pod 110 and the lid opening/closing space 124a. The exhaust by the exhaust mechanism indicated by "VENT" in FIG. 7 may be stopped after separating the transfer chamber 124 and the lid opening/closing space 124a by the gate part 121a. When the inner pressure of the pod 110 reaches a predetermined pressure (for example, twice the inner pressure of the transfer chamber 124), the exhaust mechanism indicated by "VENT" in FIG. 7 may be operated to exhaust the lid opening/closing space 124a. While replacing the inner atmosphere of the pod 110 and the inner atmosphere of the lid opening/closing space 124a with the $N_2$ atmosphere, an oxygen concentration in the lid opening/closing space 124a may be adjusted to a value equal to or less than a predetermined threshold value. In the embodiment, in addition, since, the inner atmosphere of the pod 110 is replaced with the $N_2$ atmosphere by the inert gas in advance, it is possible to shorten the time required for reaching the required oxygen concentration of the lid opening/closing space 124a.

Figure 7D:
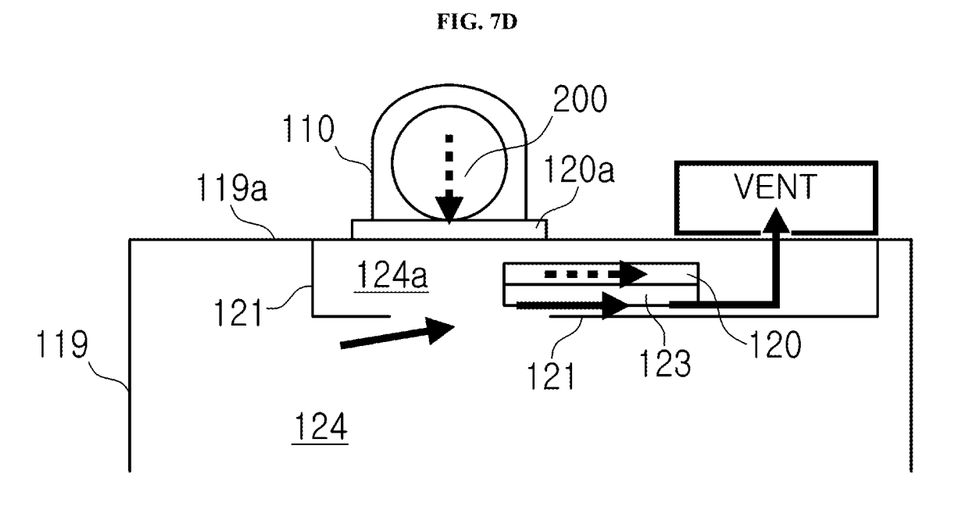
FIG. 7D schematically illustrates the operation of the lid opening/closing system according to the embodiment.

As shown in FIG. 7D, when the replacement the inner atmosphere of the lid opening/closing space 124a with the $N_2$ atmosphere is completed (i.e., the oxygen concentration in the lid opening/closing space 124a is equal to or less than the predetermined threshold value), the lid 120 of the pod 110 and the lid opening/closing mechanism 123 are slid so that the wafers 200 can be transferred from the pod 110 to the transfer chamber 124 by the wafer transport mechanism 125. The arrow (dotted line) indicated in FIG. 7D represents the flow of the inert gas from the gas introduction mechanism 1 shown in FIG. 5, and the arrow (solid line) from the transfer chamber 124 to the exhaust mechanism indicated by "VENT" in FIG. 7D represents the flow of the gas atmosphere. Alternatively, the supply of the inert gas from the gas introduction mechanism 1 shown in FIG. 5 may be stopped, while the lid 120 of the pod 110 and the lid opening/closing mechanism 123 are slid. The gate part 121a is also moved to a predetermined position (initial position) in the lid opening/closing space 124a.

Figure 7E:
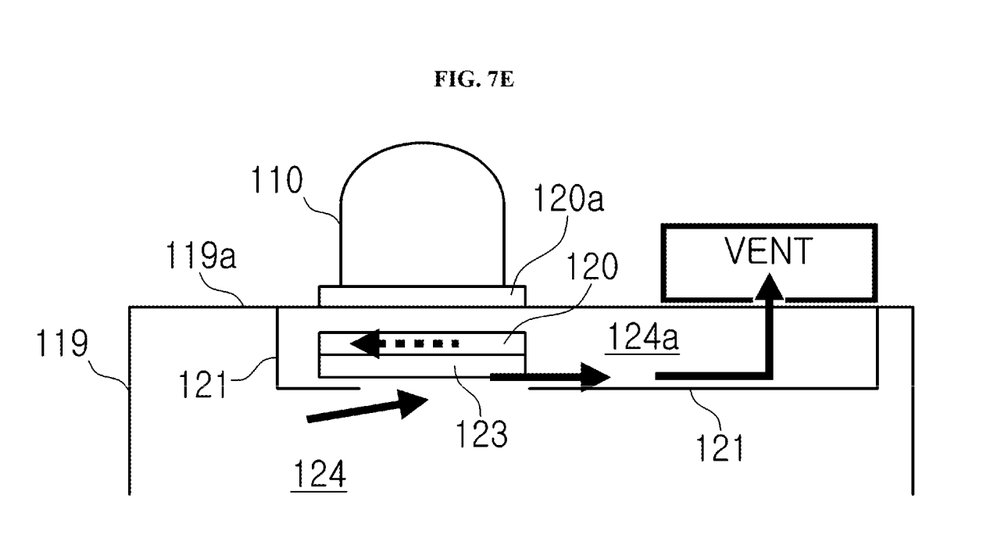
FIG. 7E schematically illustrates the operation of the lid opening/closing system according to the embodiment.

Referring to FIG. 7E), the wafers 200 are transferred by the wafer transport mechanism 125. The inner atmosphere of the pod 110 and the inner atmosphere of the transfer chamber 124 may flow through the lid, opening/closing space 124a and be exhausted by the exhaust mechanism indicated by "VENT" in FIG. 7 while the wafers 200 are transferred by the wafer transport mechanism 125. As a result, even if the particles are generated by the operation of the wafer transport mechanism 125, it is possible to reduce the amount of the particles entering the pod 110. While transferring the wafers 200 by the wafer transport mechanism 125, the inert gas may be continuously supplied by the gas introduction mechanism 1 shown in FIG. 5.

As shown in FIG. 7E, after all of the wafers 200 are transferred from the pod 110 to the transfer chamber 124, the lid 120 of the pod 110 and the lid opening/closing mechanism 123 are slid in order to attach the lid 120 to the pod 110. While sliding the lid 120 of the pod 110 and the lid opening/closing mechanism 123, the inner atmosphere of the transfer chamber 124 may be exhausted by the exhaust mechanist indicated by "VENT" in FIG. 7, and the inert gas may be supplied by the gas introduction mechanism 1 shown in FIG. 5. It is also possible to operate the lid 120 of the pod 110 and the lid opening/closing mechanism 123 after separating the transfer chamber 124 from the lid opening/closing space 124a by the gate part 121a.

Thereafter, the lid 120 is returned to the pod 110 (refer to FIG. 7F), and the pod 110 is returned to the initial position the position of the pod 110 shown in FIG. 7A) of the placement part 122. Then, the pod 110 is returned to the rotatable pod shelf 105. Another pod 110 where a predetermined number of wafers 200 to be transferred are accommodated is transferred to the placement part 122, and the lid opening/closing operation shown in FIGS. 7A through 7F are performed. The lid opening/closing operation shown in FIGS. 7A through 7F is continuously performed (repeated) until all of the predetermined number of wafers 200 to be transferred are charged into the boat 217 by the wafer transport mechanism 125.

When the predetermined number of wafers 200 are discharged from the boat 217 (wafer discharging), as described above, the lid opening/closing operation shown in FIGS. 7A through 7F is repeated until all of the predetermined number of wafers 200 in the boat 217 are discharged from the boat 217.

(7) Operation of Substrate Processing Apparatus

Hereinafter, the operation of the substrate processing, apparatus 100 according to the embodiment will be described with reference to FIGS. 1, 2 and 7. As shown in FIGS. 1 and 2, when the pod 110 is placed on the loading port shelf 114 by an in-process transfer device (not shown)

such as a RGV (Rail Guided Vehicle), the pod 110 is detected by a substrate detecting sensor 140 and the pod loading unloading port 112 is opened by the front shutter 113. The pod 110 placed on the loading port shelf 114 is loaded into the housing 111 through the pod loading/unloading port 112 by the pod transfer device 118.

The pod 110 loaded into the housing 111 is automatically transferred to and temporarily stored in the designated shelf plate 117 of the rotatable pod shelf 105 by the pod transfer device 118. Thereafter, the pod 110 is transported to one of the upper placement table and the lower placement table of the placement part 122 from the designated shelf plate 117. As shown in FIGS. 1 and 7A, when the pod 110 is transported and placed on the one of the upper placement table and the lower placement table of the placement part 122, the inert gas is introduced through a lower surface of the pod 110 by the gas introduction mechanism shown in FIG. 5. Alternatively, the pod 110 transported into the housing 111 may be transported directly to the one of the upper placement table and the lower placement table of the placement part 122 by the pod transfer device 118.

As shown in FIGS. 7B and 7C, the end face on the opening side of the pod 110 placed on the one of the upper placement table and the lower placement table of the placement part 122 is pressed against the periphery of the opening of the wafer loading/unloading of the front wall 119a of the sub-housing 119, and the lid 120 is detached by the lid opening/closing mechanism 123. Thereby, the wafer entrance 120a is opened. While detaching the lid 120, the inner pressure of the pod 110 is adjusted in advance to a pressure higher than the inner pressure of the transfer chamber 124 (i.e., the pressure of the lid opening/closing space 124a) by the gas introduction mechanism 1 shown in FIG. 5. As a result, it is difficult for the inner atmosphere of the transfer chamber 124 to enter the pod 110. Thus, even if the particles are generated by the operation of the wafer transport mechanism 125, it is possible to reduce the amount of the particles entering the pod 110.

According to the embodiment, the lid opening/closing space 124a partitioned by the front wall 119a and the partition pan 121 is provided and the exhaust mechanism indicated by "VENT" in FIG. 7 is provided in the vicinity of the front wall 119a. By forming the flow path from the pod 110 toward the exhaust mechanism indicated by "VENT" in FIG. 7, the controller 240 is configured to control (adjust) the inner atmosphere of the lid opening/closing space 124a to a desired atmosphere or to control (adjust) the inner pressure of the pod 110 when the lid 120 is detached by the operation of the lid opening/closing mechanism 123. After separation of the transfer chamber 124 from the lid opening/closing space 124a by the gate part 121a and the partition part 121 shown in FIG. 7C, the controller 240 controls the replacement operation of the inner atmosphere of the pod 110 and the inner atmosphere of the lid opening/closing space 124a with the inert gas (for example, $N_2$ gas), and controls, the inner pressure of the pod 110 and the inner pressure of the lid opening/closing space 124a.

Next, as shown in FIG. 7D, components such as the lid 120 and the lid opening/closing mechanism 123 are operated by the controller 240 so that the wafers 200 can be transferred by the water transport device 125a. Then, the wafer 200 is picked up from the inside of file pod 110 by the tweezers 125c of the wafer transport device 125a from the inside of the pod 110 through the wafer entrance 120a, aligned by notch alignment device (not shown), transported into the standby space 126 behind the transfer chamber 124, and is charged in the boat 217 (wafer charging). The wafer transport device 125a then returns to the pod 110 and transports the next wafer 200 from the pod 110 into the boat 217.

While the wafer transport mechanism 125 transports the wafer 200 from the one of the upper placement table and the lower placement table of the placement part 122 into the boat 217, another pod 110 is transferred by the pod transport device 118 from the rotatable pod shelf 105 to the other one of the upper placement table and the lower placement table of the placement pan 122. Simultaneously, as shown in FIGS. 7A through 7C, the inner pressure of the pod 110 is adjusted by supplying the inert gas by the gas introduction mechanism 1 and the lid of the pod 110 is opened by the lid opening/closing mechanism 123.

Figure 7F:
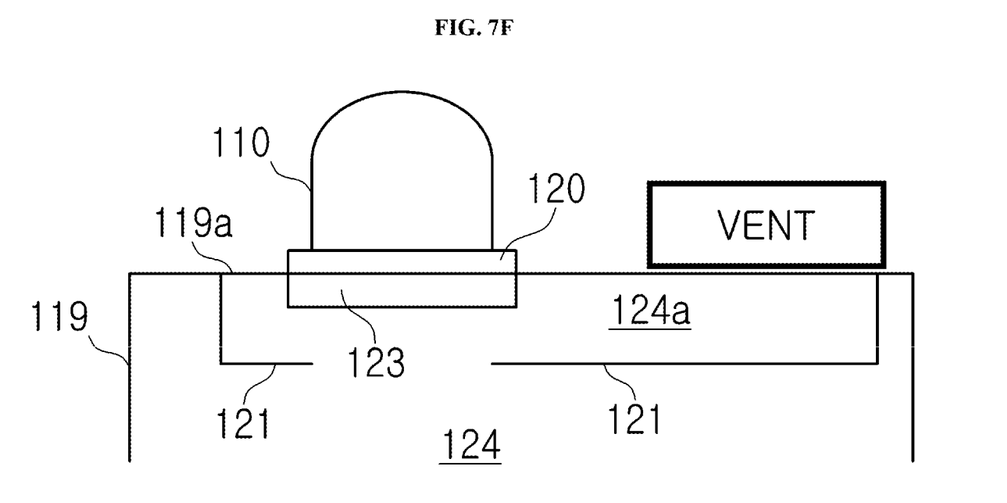
FIG. 7F schematically illustrates the operation of the lid opening/closing system according to the embodiment.

Then, after all of the wafers 200 in the pod 110 placed on the one of the upper placement table and the lower placement table of the placement part 122 is transported into the boat 217, the lid 120 is returned to the pod 110 by the lid opening/closing mechanism 123 as shown in FIGS. 7E and 7F, and the pod 110 is moved to the initial position as shown in FIG. 7A. In parallel, the wafers 700 accommodated in another pod 110 placed on the other one of the upper placement table and the lower placement table of the placement part 122 is transported into the boat 217 by the wafer transport mechanism 125.

After a predetermined number of the wafers 200 are charged into the boat 217, the lower end of the process furnace 202 closed by the furnace opening shutter 147 is opened by the furnace welting shutter 147. Then, the seal cap 219 is elevated by the boat elevator 115 and the boat 21 with the predetermined number of the wafers 200 is loaded into the process furnace 202.

After the boat 217 with the predetermined number of the wafers 200 is loaded into the process furnace 202, the wafers 200 are processed in the processing furnace 202. After the wafers 200 are processed, the boat 217 is unloaded from the process furnace 202 by the boat elevator 115 and the pod 110 accommodating the processed wafers 200 is transported out of the housing 111, in an order reverse to that described above except for a aligning process of the wafers 200 by the notch alignment, device (not shown).

Other Embodiments

The controller 240 according to the embodiment is not limited to a dedicated computer system. For example, the controller 240 can be embodied by a general-purpose computer system by preparing an external recording medium such as a USB memory and an external HDD storing a program for executing the various operations described above, and installing the program onto the general-purpose computer system using the external recording medium.

There are various ways to provide the program. For example, instead of supplying the program supply via a predetermined recording medium as described above, the program may be provided through a communication line, a communication network or a communication system. Furthermore, the program posted on a bulletin board on the communication network may be received via the communication network. The program may be transmitted by being superimposed on the carrier wave via the communication network. The program may be executed under an operating system (OS) just like any other application programs.

While the embodiment is described using a semiconductor manufacturing apparatus for processing the wafer as an example of the substrate processing apparatus, the above-described technique is not limited thereto. For example, the above-described technique can also be applied to an apparatus for processing a glass substrate such as an LCD manufacturing apparatus. For example, the above-described technique can be applied not only to a film-forming process, but also to processes such as an annealing process, an oxidation process, a nitridation process and a diffusion process. For example, the film-forming process may be a process of forming a film such as an oxide film, a nitride film and a metal-containing film.

While the technique is described by way of the above-described embodiments, the above-described technique is not limited thereto. The above-described technique may be modified in various ways without departing from the gist thereof.

According to the technique described herein, it is possible to prevent the particles from adhering onto a wafer when a lid of a pod is attached to the pod or detached from the pod.

What is claimed is:

1. A substrate processing apparatus comprising:
   a placement part whereon a substrate container accommodating substrates is placed;
   a guide part constituting a lid opening/closing space where a lid of the substrate container is attached or detached;
   a gate part separating the lid opening/closing space from a transfer chamber, wherein the substrates are transferred between the substrate container and a substrate retainer configured to accommodate the substrates via the transfer chamber;
   a lid opening/closing mechanism provided in the lid opening/closing space and configured to attach the lid of the substrate container to the substrate container and detach the lid of the substrate container from the substrate container;
   a gas introduction mechanism configured to supply a gas into the substrate container placed on the placement part; and
   a controller configured to:
      monitor and adjust an inner pressure of the substrate container by controlling the gas introduction mechanism;
      control the lid opening/closing mechanism to attach or detach the lid;
      maintain the inner pressure of the substrate container higher than an inner pressure of the lid opening/closing space while the lid opening/closing mechanism detaches the lid; and
      maintain inner pressures of the substrate container and the lid opening/closing space to be higher than a pressure of the transfer chamber by supplying the gas through the gas introduction mechanism in a state where the transfer chamber and the lid opening/closing space are separated by the gate part.

2. The substrate processing apparatus of claim 1, wherein the gas introduction mechanism is configured to replace an inner atmosphere of the substrate container with an inert gas atmosphere.

3. The substrate processing apparatus of claim 1, wherein the controller is configured to maintain the inner pressure of the substrate container higher than an inner pressure of the transfer chamber while the gas is supplied into the substrate container by the gas introduction mechanism.

4. The substrate processing apparatus of claim 1, wherein, the controller is configured to maintain the inner pressure of the substrate container higher than an inner pressure of the transfer chamber when the substrate container is placed on the placement part while the gas is supplied into the substrate container by the gas introduction mechanism.

5. The substrate processing apparatus of claim 1, wherein the controller is configured to: control the gate part to separate the lid opening/closing space from the transfer chamber; maintain the inner pressure of the substrate container higher than the inner pressure of the lid opening/closing space and an inner pressure of the transfer chamber after the lid opening/closing space is separated from the transfer chamber; and control the gate part to slide while the inner pressure of the substrate container is maintained higher than the inner pressure of the lid opening/closing space and the inner pressure of the transfer chamber.

6. The substrate processing apparatus of claim 1, wherein the controller is configured to control the gate part to separate the lid opening/closing space from the transfer chamber, and to control the lid opening/closing mechanism to detach the lid after the lid opening/closing space is separated from the transfer chamber.

7. The substrate processing apparatus of claim 1, further comprising:
   an exhaust mechanism provided in vicinity of the substrate container in which the lid is removed by the lid opening/closing mechanism and configured to exhaust an inner atmosphere of the lid opening/closing space,
   wherein, under control of the controller, a flow path is formed such that the gas supplied by the gas introduction mechanism flows toward the exhaust mechanism through the flow path when the lid is detached by the lid opening/closing mechanism.

8. The substrate processing apparatus of claim 1, further comprising:
   a transport device configured to transport the substrates between the substrate container with the lid detached and the substrate retainer,
   wherein the controller is configured to control the transport device to start transferring the substrates in the substrate container to the substrate retainer after the gate part is moved to a predetermined initial position.

9. The substrate processing apparatus of claim 1, wherein the gas introduction mechanism comprises:
   a flow rate controller configured to control a flow rate of the gas;
   a gas pipe constituting a flow path of the gas;
   a sealing part having a gas introduction part configured to introduce the gas to the substrate container; and
   an adjustment part configured to adjust the inner pressure of the substrate container.

10. The substrate processing apparatus of claim 9, wherein the sealing part comprising:
    a sealing material configured to seal the gas introduction part and the substrate container; and
    a holding part configured to hold the sealing material.

11. The substrate processing apparatus of claim 1, further comprising:
    a process furnace where the substrate retainer with the substrates charged therein are loaded and the substrates are processed.

* * * * *